United States Patent [19]
Durham et al.

[11] Patent Number: 5,896,059
[45] Date of Patent: Apr. 20, 1999

[54] DECOUPLING CAPACITOR FUSE SYSTEM

[75] Inventors: Christopher McCall Durham; Peter Juergen Klim, both of Austin, Tex.

[73] Assignee: International Business Machines Corporation, Armonk, N.Y.

[21] Appl. No.: 08/854,224

[22] Filed: May 9, 1997

[51] Int. Cl.⁶ .................... H03K 3/01; H03K 19/003
[52] U.S. Cl. .................................. 327/525; 326/38
[58] Field of Search .......................... 327/525, 526; 326/38; 365/96, 225.7

[56] References Cited

U.S. PATENT DOCUMENTS

| | | | |
|---|---|---|---|
| 4,837,520 | 6/1989 | Golke et al. | 327/525 |
| 5,212,413 | 5/1993 | Phelan et al. | 327/525 |
| 5,329,237 | 7/1994 | Horch | 324/501 |
| 5,345,110 | 9/1994 | Renfro et al. | 327/525 |
| 5,394,294 | 2/1995 | Mei et al. | 361/257.3 |
| 5,418,487 | 5/1995 | Armstrong, II | 327/525 |
| 5,506,457 | 4/1996 | Krauter et al. | 307/129 |

*Primary Examiner*—Tim Callahan
*Assistant Examiner*—Eunja Shin
*Attorney, Agent, or Firm*—Kelly K. Kordzik; Winstead Sechrest & Minick P.C.; Mark E. McBurney

[57] ABSTRACT

An apparatus to remove from operation a decoupling capacitor connected to a power supply providing power to logic circuitry in an integrated circuit. One technique for doing so is to connect a fuse in series with a decoupling capacitor. The present invention amplifies current transmitting through the fuse in a positive feedback manner to force the fuse to blow sooner than would normally occur. Therefore, when the current through the decoupling capacitor is deemed unacceptable, the fuse current is increased until such a time that the fuse opens.

3 Claims, 3 Drawing Sheets

DECOUPLING CAPACITOR FUSE SYSTEM

TECHNICAL FIELD

The present invention relates in general to integrated circuit chips, and more particularly, to decoupling capacitors on integrated circuit chips.

BACKGROUND INFORMATION

Decoupling capacitors have become necessary elements on VLSI (Very Large Scale Integration) chip designs with increased power dissipation and operating frequency. They provide the simple function of on-chip energy storage tanks for use when transient power requirements limit the immediate access to the normal power supply. That is, without decoupling capacitors (or, equivalently, a significant number/amount of decoupling capacitors), due to the inherent RLC properties and characteristics of the chip, chip package, board, power supply, etc., the reaction time of the power delivery system may not be fast enough to react to power demand. If, then, the power delivery system cannot react to the demand, a voltage drop occurs, which can have detrimental effects to the chip itself (e.g., circuit slow-down, memory state loss, etc.).

Decoupling capacitors, however, permit high power demands to pull necessary energy from their tanks, reducing or eliminating the voltage drop. The capacitors themselves are then recharged by the power supply at a secondary rate (the topic of time constants associated with the decoupling capacitor is complex and is not pertinent to the disclosure of the present invention).

Many methods have been devised to create the decoupling capacitors in standard VLSI processes. The most common method involves creating standard gate (thin) oxide over either a substrate or an n/p well, and tying the power supply voltages to either side of the thus created parallel plate capacitor. See, for example, U.S. Pat. Nos. 5,304,506, 5,394,294, and 5,329,237. This permits the decoupling capacitor to be created in a standard CMOS (complementary metal-oxide semiconductor) process with little or no mask addition or process complication.

However, complications do arise in the manufacture of such structures. Because they are made from gate (thin) oxide, they are subject to oxide shorts, perhaps the largest yield detractor in cutting-edge CMOS processes. And, because they consist of a large area of thin oxide, the probability of an oxide defect is highly increased. As a result, many of the created on-chip decoupling capacitors are defective and create shorts from the power supply to ground, causing increased power consumption, which then further aggravates the need for decoupling capacitors by increasing peak power demands. Note that such shorts may be large enough to cause the capacitor to become completely ineffective (and should be removed from the system) or small enough to create more chip stand-by current but still retaining a significant energy storage advantage. Note that in both cases the chip remains functional: an undesired decoupling capacitor does not affect the chip operation.

As a result, methods have been devised to selectively turn off or remove the decoupling capacitors from the system when such defects occur for both capacitor functionally and chip current purposes. That is, a non-functioning decoupling capacitor is unnecessary. Also, because most failures in such capacitors occur when the plates are resistively coupled and because the plates are necessarily connected to power and ground, such a non-functioning capacitor necessarily causes an unnecessary increase in chip power dissipation.

The most popular method for removing the decoupling capacitor from the system involves the addition of a fuse into the decoupling capacitor circuitry, as shown in FIG. 1. Referring to FIG. 1, as will be appreciated by those skilled in the art, a typical integrated circuit has a number of logic circuits, such as logic circuits 101 and 102, formed on a semiconductor substrate 10 by a sequence of well-known process steps. Each logic circuit 101, 102 is connected to an appropriate voltage source V+ also located on the semiconductor substrate 10. A decoupling capacitor 105, 106 couples the voltage source V+ to a suitable common or "ground" terminal so that any sharp fluctuations in the voltage (i.e., bounce) of the voltage source V+ are shunted through the decoupling capacitor 105, 106 to ground. In this manner, the decoupling capacitor 105, 106 isolates the logic circuit 101, 102 from rapid changes in power supply voltages.

Removal of the decoupling capacitor 105, 106 involves blowing the fuse 103, 104. Note, the physical arrangement of the fuse with respect to the decoupling capacitor can be reversed so that a terminal of the fuse is coupled to ground. In either embodiment, the opening of the circuit by deleting the fuse link 103, 104 prevents current flow from the supply source V+ through the failing ("failing" means defective and leaking current through the parallel plate structure due to dielectric failure) capacitor 105, 106 to ground.

The fuse 103, 104 is traditionally constructed using a long thin metal line. When the capacitor 105, 106 becomes defective, electromigration effects based on the unidirectional flow to ground force the atoms in the metal wire to move (migrate), which over time creates an open. Such effects may take minutes, hours, or even years to "blow" the fuse 103, 104.

This, creates a dilemma in the circuit based on the time involved for the fuse 103, 104 to blow (open). That is, if the resistor coupled between the capacitor plates is large (indicating a smaller, but still important, defect), then the current between the plates and the fuse is small, which means the electromigration-blown fuse will take a long time to open. Thus, small defects, although they degrade or negate the capacitor's effectiveness, will take a long time to demonstrate themselves in the removal of the associated decoupling capacitor 105, 106.

Therefore, there is a need in the art for an improved system for blowing a fuse coupled to a decoupling capacitor.

SUMMARY OF THE INVENTION

The present invention addresses the foregoing need by causing the electromigration-driven fuse to blow, or open, at an accelerated rate. This is accomplished by pushing more current through the fuse by sensing the current flow through the capacitor plates and the fuse and then providing positive feedback via a feedback circuit. Such a feedback circuit may be a current sensing circuit coupled with an N-channel field effect transistor ("NFET").

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
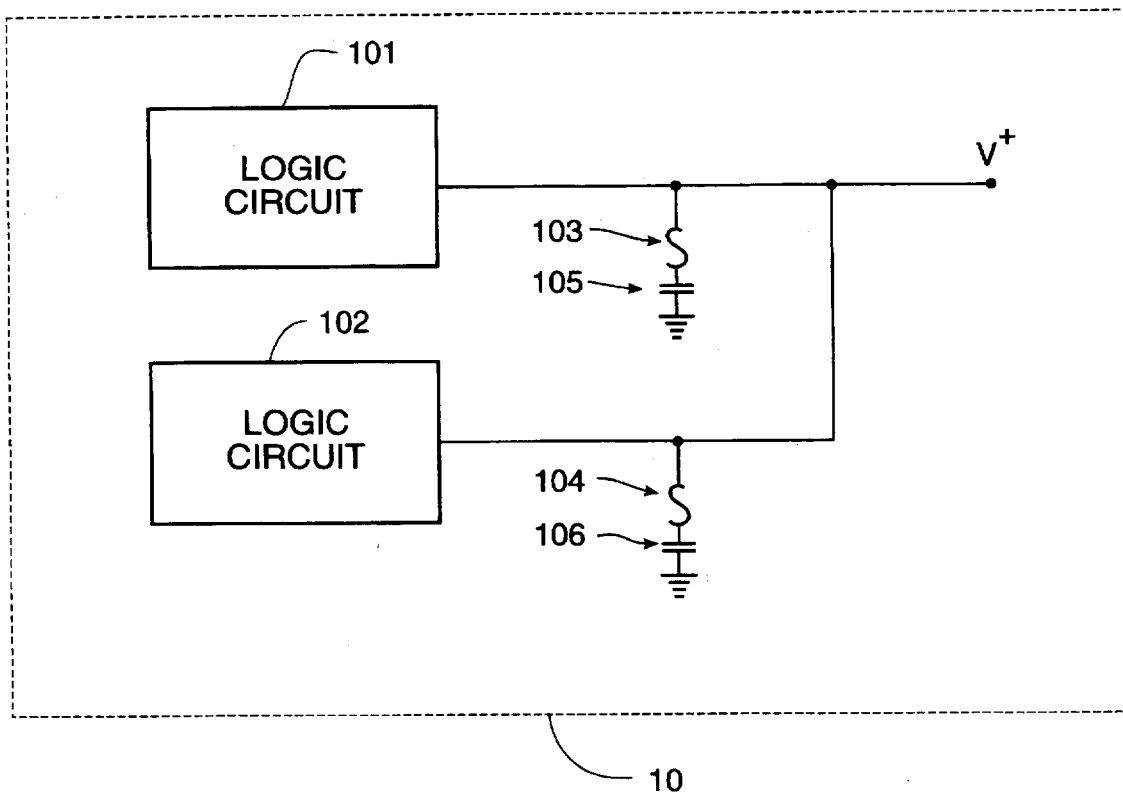
FIG. 1 illustrates a prior art system for removing a decoupling capacitor from logic circuitry.

In the following description, numerous specific details are set forth to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

Figure 2:
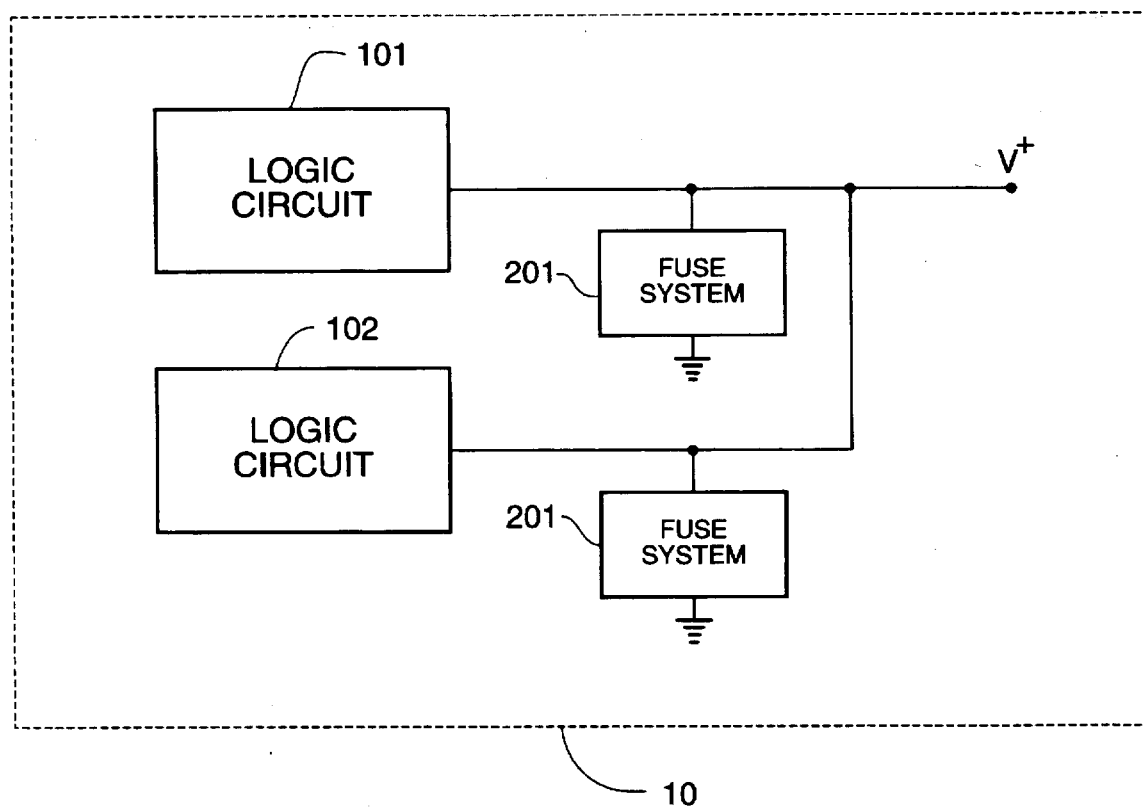
FIG. 2 illustrates an embodiment of the present invention.

Referring to FIG. 2, there is illustrated an embodiment of the present invention whereby the fuse system 201 of the present invention is substituted for the series arrangement of the decoupling capacitor and fuse as shown in

FIG. 1.

Figure 3:
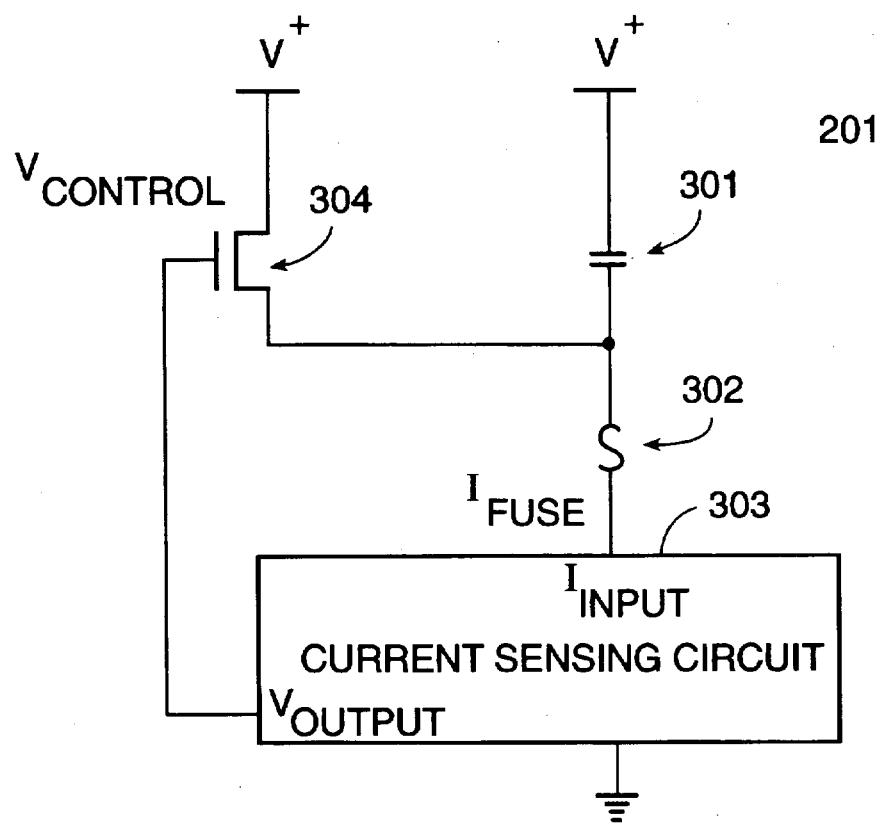
FIG. 3 illustrates a detailed circuit diagram of the present invention.

Referring next to FIG. 3, there is illustrated a detailed circuit diagram of fuse system 201. Fuse system 201 is comprised of decoupling capacitor 301 and fuse 302 connected in series between power supply V+ and ground with current sensing circuit 303. Current sensing circuit 303 receives current $I_{FUSE}$, which is transmitted through decoupling capacitor 301 and fuse 302. In response, current sensing circuit 303 then outputs $V_{OUTPUT}$, which is used to drive the gate electrode of NFET 304, which is coupled between V+ and a node connecting decoupling capacitor 301 and fuse 302.

Figure 4:
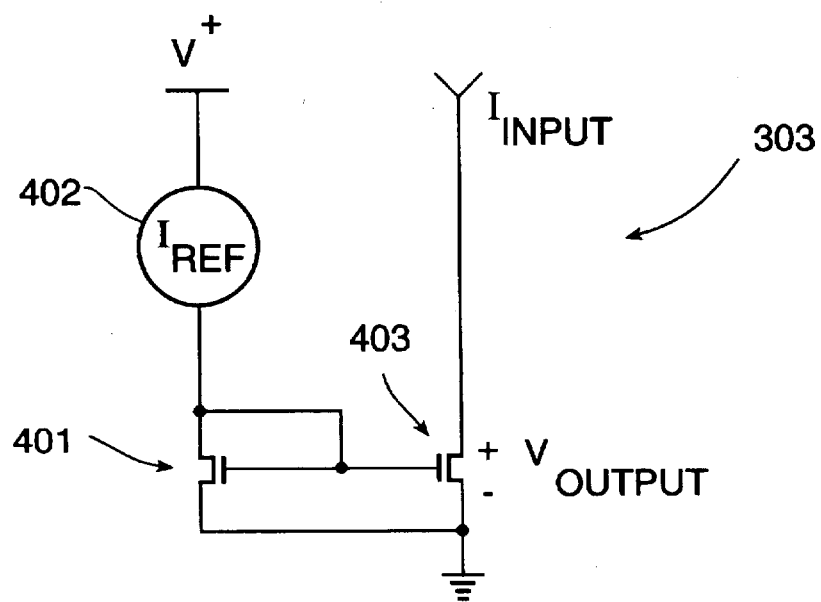
FIG. 4 illustrates a circuit diagram of a current sensing circuit.

Current sensing circuit 303 may be constructed in various ways. An example of such a circuit, also referred to as a "simple current amplifier", is illustrated in FIG. 4. Current sensing circuit as illustrated in FIG. 4 is comprised of current source 402 producing reference current $I_{REF}$, and NFETs 401 and 403. Circuit 303 illustrated in FIG. 4 is well-known in the industry. For example, see *Analysis and Design of Analog Integrated Circuits-Second Edition*, by Paul R. Gray and Robert G. Meyer, Ch. 12, p. 710. Note that this text also illustrates other embodiments of such a current sensing circuit.

An alternative embodiment of the present invention could be used whereby NFET 304 is replaced with a P-channel FET, although such a substitution would necessitate the inversion of the logic state of the voltage from the current sensing circuit 303 to properly control the PFET device. An NFET has been chosen because they typically are smaller (by 2×) for generating an identical current.

In operation, when a defect occurs in decoupling capacitor 301, a current begins to flow through fuse 302 ($I_{FUSE}$). This current $I_{FUSE}$ is an input ($I_{INPUT}$) to current sensing circuit 303, which then generates an output voltage $V_{OUTPUT}$ when $I_{INPUT}$ exceeds the reference current $I_{REF}$. Note that $I_{REF}$ is set by the design of current sensing circuit 303 and approximately indicates the maximum desirable/acceptable defect current through decoupling capacitor 301. $V_{OUTPUT}$ is then used as $V_{CONTROL}$ to turn on NFET 304, which then sources more current, raising $I_{FUSE}$. This, in turn, causes current sensing circuit 303 to further increase the signal strength of $V_{control}$, which increases $I_{FUSE}$, and so on. This process then continues until fuse 302 opens (blows) due to electromigration effects. This removes decoupling capacitor 301 from the power-ground system, which is the desired effect.

In summary, the operation of circuit 201 amplifies the fuse current $I_{FUSE}$ in a positive feedback manner to force the fuse 302 to blow sooner than would normally occur. That is, when the current through decoupling capacitor 301 is deemed unacceptable (by the design point of current sensing circuit 303) the fuse current $I_{FUSE}$ is increased until such a time that it opens.

Although the present invention and its advantages have been described in detail, it should be understood that various changes, substitutions and alterations can be made herein without departing from the spirit and scope of the invention as defined by the appended claims.

What is claimed is:

1. An integrated circuit compromising:

a logic circuit;

a power supply providing power to said logic circuit;

a decoupling capacitor;

a fuse;

a current sensing circuit, wherein said decoupling capacitor, said fuse and said current sensing circuit are coupled in series between said power supply and ground; and an NFET coupled between said power supply and a node connecting said decoupling capacitor and said fuse, wherein a gate electrode of said NFET is coupled to said current sensing circuit.

2. The integrated circuit as recited in claim 1, wherein said current sensing circuit produces a voltage signal proportional to current passed through said fuse, and wherein said voltage signal is provided to said gate electrode causing said NFET to drive more current through said fuse until it blows due to electromigration effects.

3. A method for removing a decoupling capacitor from a power supply providing power to a circuit, said method comprising the steps of:

providing a logic circuit;

providing a power supply providing power to said logic circuit;

providing a decoupling capacitor;

providing a fuse;

providing a current sensing circuit, wherein said decoupling capacitor, said fuse, and said current sensing circuit are coupled in series between said power supply and ground;

providing an NFET coupled between said power supply and a node connecting said decoupling capacitor and said fuse, wherein a gate electrode of said NFET is coupled to said current sensing circuit;

producing, by said current sensing circuit, a voltage signal proportional to current passed through said fuse; and providing said voltage signal to said gate electrode causing said NFET to provide more current through said fuse until it blows due to electromigration effects.

* * * * *